United States Patent [19]

Salensky et al.

[11] Patent Number: 4,976,813

[45] Date of Patent: Dec. 11, 1990

[54] PROCESS FOR USING A COMPOSITION FOR A SOLDER MASK

[75] Inventors: George A. Salensky, Whitehouse Station; Thomas S. Thoman, Cranford, both of N.J.

[73] Assignee: Amoco Corporation, Chicago, Ill.

[21] Appl. No.: 343,744

[22] Filed: Apr. 27, 1989

Related U.S. Application Data

[63] Continuation-in-part of Ser. No. 214,380, Jul. 1, 1988.

[51] Int. Cl.$^5$ ................................................. B44C 1/17
[52] U.S. Cl. ..................................... 156/230; 156/249; 427/96; 427/259; 428/901
[58] Field of Search ..................... 156/230, 233, 249; 427/96, 259, 272, 304; 430/319, 327; 428/901

[56] References Cited

U.S. PATENT DOCUMENTS

| | | | |
|---|---|---|---|
| 2,721,153 | 10/1955 | Hopf et al. | 427/96 |
| 3,703,603 | 11/1972 | Levesoue et al. | 427/96 X |
| 4,120,843 | 10/1978 | Ameen et al. | 427/259 |
| 4,264,477 | 4/1981 | Seeger et al. | 252/503 |
| 4,415,624 | 11/1983 | Prabhu | 427/101 X |
| 4,506,004 | 3/1985 | Sullivan | 156/230 X |
| 4,560,584 | 12/1985 | Henninger | 427/259 X |
| 4,635,346 | 1/1987 | Matsuzaki | 156/326 X |
| 4,722,765 | 2/1988 | Ambros et al. | 156/233 X |
| 4,775,439 | 10/1988 | Seeger, Jr. et al. | 427/96 X |
| 4,803,543 | 2/1989 | Inayoshi | 156/330 X |

OTHER PUBLICATIONS

Handbook of Printed Circuit Manufacturing, Raymond H. Clark, pp. 240-244.

*Primary Examiner*—David Simmons
*Assistant Examiner*—James J. Engel, Jr.
*Attorney, Agent, or Firm*—Morgan & Finnegan

[57] ABSTRACT

This invention relates to a solder mask composition for thermoplastic substrates. The solder mask has critical components which include a polyhydroxyether and melamine formaldehyde. Other components include a solvent, filler and flow control agent. Optional ingredients include a colorant, epoxy resin and acid to promote the reaction of the composition. A surfactant can also be included. The solder mask provides the necessary flexibility and adhesion required for thermoplastic circuit boards. The mask can be applied directly to a circuit board or to a transfer medium for subsequent covering of a substrate. It relates to an article which can be a circuit board. It also relates to a process for making such composites which includes processing the solder mask.

4 Claims, No Drawings

PROCESS FOR USING A COMPOSITION FOR A SOLDER MASK

RELATED APPLICATION

This application is a continuation-in-part of U.S. application Ser. No. 214,380 filed 7/1/88 entitled "Solderable Printed Circuits Formed Without Plating". The applications are commonly assigned. This application is incorporated by reference.

FIELD OF THE INVENTION

This invention relates to solder mask compositions, a solder mask product, alone or in combination with a substrate or circuit board, and process for using the composition. This solder mask is particularly useful in connection with printed circuit boards composed of polyarylsulfone.

BACKGROUND OF THE INVENTION

A solder mask is a coating. It is applied to printed circuits to prevent molten solder from adhering to select portions of the printed circuit. Typically, the solder mask is applied using conventional screen printing techniques. This enables the entire surface of the board to be covered except for connection locations such as holes, pads and contact fingers. After soldering, the solder adheres only to the connection locations because the solder mask covers other locations. Without a solder mask, solder would not only stick to the dielectric substrate but also bridge across that substrate and short circuit conductors. Through use of the solder mask, the ability of molten solder to adhere to the circuit board surface is greatly reduced.

Typically, a solder mask is applied only to the solder side of the circuit board. It can be applied to both sides.

Typically, there are four kinds of solder masks: (1) two part epoxy, (2) one part epoxy, (3) ultraviolet curable and (4) dry film solder masks. These are screen printed onto a circuit board except for the latter mask. That dry film mask is laminated onto the circuit board surface exposed with a photo tool and UV light, and developed like photoresist.

Two part epoxy solder masks must be weighed and mixed thoroughly before they are screen printed. If this is not done, the mask may have streaky discoloration and poor adhesion during wave soldering. This mask is cured to hardness, heat resistance and chemical resistance by baking in a forced convection oven.

The one part mask does not require mixing. Due to its high viscosity, it is more difficult to print. The material also cures by oven baking, but the baking time is about double compared to the two part epoxy solder mask. With both epoxy masks, they must be cured sufficiently to avoid white spots or a white film appearing on their surface after wave soldering.

UV curable masks offer shorter curing times and low volatile content. The masks are screen printed. Then, they are run through a conveyorized ultraviolet light source for curing. Some baking facilitates completion of the cure. The low volatiles content avoids having to remove solvent during the curing cycle. Using this mask helps avoid contamination. However, UV curable masks are expensive, require excellent exposure control and require excellent cleanliness and dryness of the circuit board before the mask is applied. Otherwise, disadvantages occur, specifically, blistering of the mask during wave soldering and poor adhesion.

Dry film solder masks involve acrylic photopolymer technology. Their main advantages are utilization in tightly spaced conductors, finer registration of the mask to the board, absence of bleeding, and enhanced mechanical and electrical protection for the printed circuit. This kind of mask also has disadvantages including criticality of surface cleanliness and dryness to promote adhesion, expense, complicated use, substantial expense for laminating equipment, and critical exposure control.

Solder masks are more difficult to print than are plating resist. The material has a high viscosity and is printed over a raised surface, that is, the plated circuitry. Solder masks require greater pressure on the stencil than is required during a typical screen printing operation. The printing strokes should be slow enough to flood between the circuit traces. A coarse screening mesh should be used during printing. Exposure of the stencil is about 25% longer than is required for printing plating resist. This extra exposure time makes the stencil a little thicker and stronger.

Sometimes bleeding occurs and the solder mask flows onto the pads. This may require blotting the stencil periodically. Moreover, inspection of each panel is required before the mask is applied. This is necessary because the solder mask can not be stripped without damaging the surface of the printed circuit. See, R. Clark, *Handbook Of Printed Circuit Manufacturing*, pp. 241-244 (1985), hereby incorporated by reference.

The present invention overcomes disadvantages of the prior art while providing improved adhesion and flexibility to the printed circuit and impairs growth in the barrier layer. The flexibility and adhesion characteristics permit the mask to be applied to a transfer medium above or combined with other layers for subsequent lamination to a substrate having a complex surface configuration. Applicants' solder mask composition is particularly useful with thermoplastic substrates which cannot utilize conventional epoxy solder masks.

SUMMARY OF THE INVENTION

This invention relates to a solder mask composition comprising polyhydroxyether, melamine formaldehyde, solvent, filler and flow control.

This invention also relates to a solder mask composition for thermoplastic substrate comprising about 10 to 16 weight percent polyhydroxyether, about 2 to 7 weight percent melamine formaldehyde, about 37 to 70 weight percent solvent having a boiling point between about 230° C. to 250° C., about 14 to 27 weight percent filler, and about 2.5 to 4.5 to weight percent flow control agent, all percents by weight of the composition.

This invention further relates to a solder mask composition for thermoplastic substrates comprising about 12% polyhydroxyether, about 60% diethylene glycol monobutyl ether acetate, about 3% melamine formaldehyde, about 3% phthalo cyanine green, about 18% mica, about 2% epoxy novolac resin, about 3% silica, and a reaction promoting concentration of dinonylnaphthalene sulfonate ester, all percents by weight of the composition.

This invention also further relates to a flexible solder mask comprising polyhydroxyether, melamine formaldehyde, solvent, filler and flow control agent.

This invention also relates to a flexible solder mask for thermoplastic substrates comprising about 10 to 16 to weight percent polyhydroxyether, about 2 to 7 to weight percent melamine formaldehyde, about 37 to 70 weight percent solvent having a boiling point between about 230° C. and 250° C., about 14 to 27 weight percent filler, and about 2.5 to 4.5 weight percent flow control agent, all percentages by weight of the composition.

This invention also relates to a flexible solder mask for thermoplastic substrate comprising about 12% polyhydroxyether, about 60% diethylene glycol monobutyl ether acetate, about 3% melamine formaldehyde, about 3% phthalo cyanine green, about 18% mica, about 2% epoxy novolac resin, about 3% silica, and a reaction promoting concentration of dinonylnaphthalene sulfonate ester, all percentages by weight of the composition.

This invention also relates to a process for forming a directly solderable printed circuit article comprising:

(1) providing a release surface;
(2) applying a solder mask over the release surface and drying the solder mask;
(3) applying an ink comprising a thixotropic thermosetting resin composition containing a desired amount of an electrically conductive metal powder and high surface area metal flake to the release surface over the mask in the configuration of an unplated, solderable electric circuit element and drying the ink;
(4) printing in registration with the ink circuit element and mask a reactive thixotropic adhesive interface capable of interacting with the thermosetting resin composition of step (3) and with a thermoplastic dielectric surface and drying the adhesive;
(5) bringing together the release surface and the thermoplastic dielectric surface so that the solderable electrical circuit element is facing the dielectric surface and is separated therefrom by the adhesive interface; and
(6) applying sufficient heat and pressure to form a composite structure whereby the thermosetting resin is cured and the adhesive is interacted whereby the electrical circuit element is transferred from the release surface and bonded to the thermoplastic dielectric surface.

This invention also relates to a directly solderable flexible printed circuit article comprising:

(a) a thermoplastic dielectric support surface;
(b) a first pathway on the surface comprising a thixotropic thermoset resin and electrically conductive metal powder and high surface area conductive metal flake configuration of a solderable electric circuit element bonded to the support surface using a thixotropic adhesive printed in registration on the pathway; and
(c) a solder mask covering portions of the support surface and conductive ink.

DETAILED DESCRIPTION OF THE INVENTION

The present invention relates to manufacture of printed circuitry using a new solder mask applied to thermoplastic, for example, polyarylsulfone, substrates or circuit boards In this regard, the manufacturer utilizes conventional thick-film printing techniques to image circuit patterns on a release substrate for transfer and adherence to a molded substrate. The solder mask is applied either initially to the release substrate or subsequently to the molded substrate laminated with the circuit pattern.

As mentioned in the related application, a new conductive ink and a new adhesive, which obviates the need for a plating step required by other processes to make the circuit solderable, are taught. These materials used with a transfer process provide a metal rich surface suitable for conventional soldering. The present invention is directed to a solder mask for thermoplastic substrates, such as polyarylsulfone substrates, to which the circuit patterns and solder mask are adhered. The solder mask covers the conductive ink circuit pattern.

Printing a conductive ink on a release medium in a form of a solderable electrical circuit which is then preferably overcoated in registration with an adhesive for subsequent transfer to a substrate has been discovered. This article can be directly soldered. Applicants have discovered a new solder mask composition which improves the circuit board. Applicants' contribution is best considered in connection with the manufacture of a circuit board.

TRANSFER PROCESS FLOW CHART (1) Print and Dry Solder Mask Composition with or without legending On Releasable Medium
(2) Print and Dry Thermosetting Circuit On Solder Mask On Releasable Medium
(3) Print and Dry Adhesive On Circuit On Releasable Medium
(4) Prepare Thermoplastic Substrate
(5) Transfer Printed Material On Releasable Medium To Substrate
(6) Cure Substrate Article With Transferred Material
(7) Apply Flux To Circuit Article
(8) Pre-heat Circuit Article
(9) Solder Circuit Article Of course, the solder mask composition can be applied after the circuit is transfered to the substrate, that is, after step 5.

A solder mask composition is applied to a conventional release substrate. This mask can be applied in conjunction with conventional legend material, that is, identification or processing information such as an outline of the circuit pattern or printed information about the manufacturer or use of the product. Once applied, the mask is dried.

After the conductor is printed and dried over the mask, an adhesive is applied, preferably in registration, over the printed conductor. The release paper with the solder mask, printed circuit and adhesive is dried. Drying can be done at 96° C. in a forced convection oven for ten minutes to evaporate solvent in the printed ink circuit. A conveyor oven or infrared oven is used to reduce drying time to about 30 seconds. This removes the solvent and provides the required cure for adhesion development to the substrate during the transfer step. About three minutes are needed for this transfer step. The adhesive complements the ink, that is, it is formulated to chemically interact with the ink and the binder used in the ink formulation.

The substrate for the circuit board is treated to facilitate transfer of the printed circuit to it. The surface of the substrate is prepared essentially instantaneously. According to known methods, hot solvent vapors melt or plasticize and reflow the surface of the substrate. This effects clarity in surface finish and no apparent stress cracking of the substrate occurs.

In this vapor polishing technique, the substrate surface is exposed to vapors of a solvent. The surface is exposed to the vapors usually in a container, so that the entire surface area is contacted by the vapors. The surface is contacted until a desired surface finish is obtained. This contact time is between 0.5 and about 3 seconds. Alternatively, the substrate can be immersed in a solvent mixture at about room temperature or lower for about 3 minutes to get a uniform substrate surface.

Thereafter, the solder mask, conductor and adhesive are transferred to the substrate. This is done using heat and pressure for three minutes. During the transfer process, the solder mask, conductor, adhesive and substrate all partially chemically react to form a permanent thermally resistant bond. Thus, the circuit/substrate unit or article is heated for about 30 minutes at 150° C. to cure it further.

Alternatively, the solder mask can be applied to the substrate after the conductor has been transfered to it. Thus, the solder mask is applied to a finished article rather than initially to a release medium.

Afterwards, flux is applied to the circuit and the article is preheated. Then, the circuit is soldered to connect electrical leads to it. Soldering can be done using a conventional wave solder technique at about 6 ft/min and at 246° C. solder bath temperature, using a preheat temperature of 135°–138° C. as measured on the top of the circuit/substrate unit with a thermocouple. Overall, the processing conditions are conventional to those skilled in the art.

The solder mask composition comprises a polyhydroxyether, methylated melamine formaldehyde, solvent, filler and flow control agent. The polyhydroxyether is a critical component of the composition. The methylated melamine formaldehyde is the other critical component of the composition and is required to promote cross-linking for the system.

The solvent, preferably has a boiling point between about 230° C. and 250° C. Preferably, the solvent is a diethylene glycol monobutyl ether acetate. In general, any high boiling point solvent can be used as long as it keeps the system workable, that is, provides a drying time of a half a minute or better. Any colorant can be used that is compatable with the solvent and the polyhydroxyether. Normally, the colorant contains solvent and epoxy. Any filler can be utilized. The preferred fillers are mica, for example, Mica 3000, talc and BaSO$_4$. Any flow control agent can be used. The preferred agent is silica, having a surface area of about 50 to 200 m$^2$/gm, which is pyrogenic silica treated to make it more hydrophobic. The purpose of the agent is to provide proper flow characteristics and rheology. A defoaming agent can be used. Typically, these include BYK 053 (solution of polyalkyl acrylate) or BYK 077 (solution of methylalkyl polysiloxone) by BYK Chemie USA.

Optionally, a low molecular weight epoxy resin, for example, an epoxy novalac resin produced by Dow Chemical Company under the trade name DEN 431 or diglycydil ether of bis phenol A, can be used. The purpose of the epoxy novalac resin is to promote the toughness of the product by modifying the flexibility of the system. The resin preferably has a viscosity of 1000 to 20,000 cps. Also, a latent acid catalyst or acid catalyst can be utilized which promotes reaction of the solder mask composition. Latent Acid Catalyst (epoxy blocked sulphonic acid) like dinonyl napthalene sulphonic acid (30% active) made by King Industries under the name Nacure 1419 (2–4% solution based upon resin solids) can be used. The preferred acid catalyst is benzoic acid. Further, a surfactant may be utilized which promotes wetting and flow properties of the composition. A Silane coupling agent, which is epoxy functional, can be used like Union Carbide UCAR A-187 1% based upon filler concentration.

The components of the solder mask composition can have the following range of concentrations in percent by weight of the total composition:

| COMPONENT | CONCENTRATION RANGE (WT. %) |
| --- | --- |
| Polyhydroxyether | 10–16 |
| Solvent | 37–70 |
| Melamine Formaldehyde | 2–7 |
| Filler | 14–27 |
| Flow Control Agent | 2.5–4.5 |
| Defoaming Agent | 0–3 |
| Epoxy Resin | 1.0–2.0 |
| Additive | 2.5–4.5 |
| Coupling Agent | 0–0.3 |
| Acid Catalyst | 0–2 |

The substrate may be any known dielectric, that is, insulating or non-conducting substrate. The solder mask composition can be used on any substrate material having proper thermal stability. Preferred substrates will be taught below.

In general, thermoplastics exhibit a more complex range of chemical, thermal, and mechanical behavior than traditional thermoset printed circuit board laminates. This makes material selection for printed circuit use even more critical. Current resin systems typically exhibit one or two desired characteristics but in general lack the overall property balances to make them good printed circuit support condidates. Resin deficiencies become readily apparent during assembly operations where substrate warpage, bubbling, dimensional instability and printed circuit delamination are common occurrences.

To address this need, applicants use engineering resins called polyarylsulfone. These resins offer a highly desirable property balance for circuit board uses where excellent dimensional stability, warp resistance and bonding of circuit and substrate are requirements.

Polyarylsulfone resins are characterized by inherently high heat distortion temperatures, excellent dimensional stability, creep resistance, low loss AC dielectric properties, and high mechanical strength.

TYPICAL PROPERTIES OF POLYARYLSULFONE RESINS

| Property | Units | Typical Property |
| --- | --- | --- |
| Tensile Strength | psi | 13,400 |
| Elongation to Break | % | 2.2 |
| Tensile Modulus | psi | 892,000 |
| Flexural Strength | psi | 19,300 |
| Heat Deflection Temperature | °C. | 215 |
| Density | gm/cc | 1.55 |
| AC Dielectrics | | |
| Dielectric Constant | | |
| 60 Hz | — | 3.86 |
| 1 KHZ | — | 3.85 |
| Dissipation Factor | | |
| 60 Hz | — | 0.0042 |
| 1 KHZ | — | 0.0035 |
| Dielectric Strength | | |
| ⅛" specimen | Volts/mil | 398–550 |
| Volume resistivity at 50° C. | meg ohm-cm | $0.41 \times 10^{11}$ |

Polyarylsulfone resins are easily processed utilizing standard injection molding machinery and practice. Prior to molding, resins should be dried to obtain optimum performance in a dehumidified hopper drier or circulating air oven. Utilization of a hopper drier preferred with an inlet air temperature in the 149°–163° C. range and an outlet temperature not less than 135° C. When tray drying is utilized, pellets should be spread into a layer 1–2″ in depth. It is important in all cases that the pellets reach and maintain a minimum temperature of 135° C. for 3–4 hours. Dried resin should be molded promptly and handled carefully to preclude moisture reabsorption.

The rheological characteristics of polyarylsulfone resins provide excellent flow for filling thin and intricate wall sections typically encountered in printed wiring boards, chip carriers, and related devices. The resins process readily at stock temperatures in the 360°–382° C. range (wave soldering grade). Mold temperatures of 110°–157° C. are used typically with the resin for wave solderable moldings. Clean polyarylsulfone resin scrap may be reground and utilized in fabrication, provided it is properly dried and kept free of contamination.

Polyarylsulfone produces warp-free moldings that are dimensionally stable both prior to and following the transfer process. Transferred circuitry exhibits tenacious adhesion to the resin as transferred, and maintains its adhesion following wave soldering.

Additives which may be used with the thermoplastic and/or thermosetting resin for making the printed circuit board, include reinforcing and/or nonreinforcing fillers such as wollastonite, asbestos, talc, alumina, clay, mica, glass beads, fumed silica, gypsum and the like; and reinforcement fibers such as aramid, boron, carbon, graphite, and glass. Glass fiber is the most widely used reinforcement in the form of chopped or milled strands, ribbon, yarn, filaments, or woven mats. Mixtures of reinforcing and non-reinforcing fillers may be used, such as a mixture of glass fibers and talc or wollastonite. These reinforcing agents are used in amounts of from about 10 to 80 weight percent, whereas the non-reinforcing fillers are used in amounts of up to 50 weight percent. other additives include stabilizers, pigments, flame retardants, plasticizers, processing aids, coupling agents, lubricants, mold release agents, and the like. These additives are used in amounts which achieve desired result.

Polyarylsulfone is the preferred thermoplastic polymer substrate of the invention. It is an amorphous thermoplastic polymer containing units of the formula:

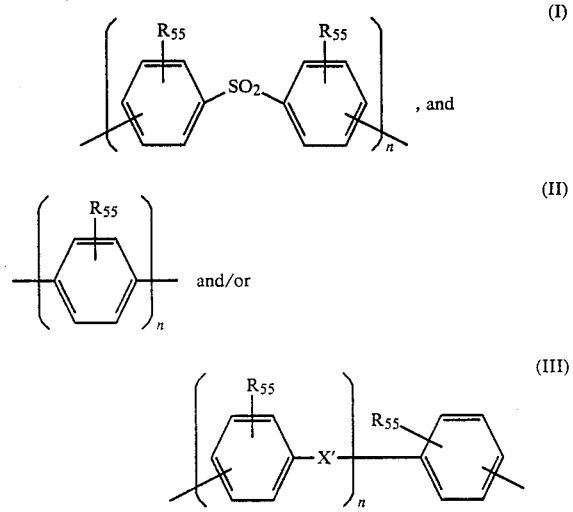

wherein $R_{55}$ is independently hydrogen, $C_1$ to $C_6$ alkyl to $C_4$ to $C_8$ cycloalkyl, X is independently

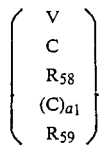

wherein $R_{56}$ and $R_{57}$ are independently hydrogen or $C_1$ to $C_9$ alkyl, or

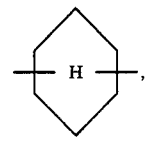

wherein $R_{58}$ and $R_{59}$ are independently hydrogen or $C_1$ to $C_8$ alkyl, and $a_1$ is an integer of 3 to 8; —S—, —O—, or

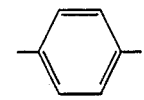

a is an integer of 0 to 4 and n is independently an integer of 1 to 3 and wherein the ratio of unit (I) to the sum of units (II) and/or (III) is greater than 1. The units are attached to each other by an —O— bond. A preferred polymer of this invention contains units of the formula:

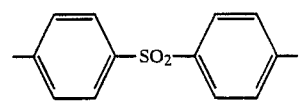

and

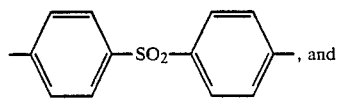

Another preferred polyarylsulfone of this invention contains units of the formula:

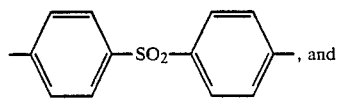

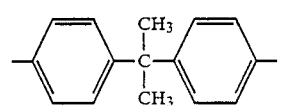

These units are attached to each other by an —O— bond. The polyarylsulfone may be random or may have an ordered structure. The polyarylsulfones of this invention have a reduced viscosity of from about 0.4 to greater than 2.5, as measured in N-methylpyrrolidone, or other suitable solvent, at 25° C.

EXAMPLE

The invention will now be described with an example of the teaching set forth above. This example is exemplary and not exclusive. It is not considered limiting. Concentrations are percent by weight of the mixture unless otherwise indicated.

EXAMPLE 1

The following solder mask composition is mixed:

| TRADE NAME | CHEMICAL NAME | PERCENT (WT) |
| --- | --- | --- |
| PHENOXY PKFE | POLYHYDROXYETHER | 11.89 |
| BUTYL CARBITOL ACETATATE | DIETHYLENE GLYCOL MONOBUTYL ETHER ACETATE | 59.72 |
| CYMEL 325 | MELAMINE FORMALDEHYDE | 2.56 |
| — | PHTHALO CYANINE GREEN DISPERSION (17% Active) | 3.39 |
| MICA 3000 | MICA | 17.84 |
| DEN 431 | EPOXY NOVOLAC | 1.49 |
| — | SILICA-CABOSIL | 2.97 |
| — | BENZOIC ACID | 0.14 |

This composition is applied over VNS Supermat release paper. It is dried in an oven for 10 minutes at 150° C.

The following ingredients in percent by weight are also blended together at room temperature:

(I) 1.81 percent polyhydroxyether known as PKFE, (II) 2.75 percent 3,4 epoxy cyclohexyl methyl 3,4 epoxy cyclohexyl carboxylate known as epoxy ERL-4221, and (III) 8.47 percent diethylene glycol monobutyl ether acetate known as butyl Carbitol acetate.

To this mixture is added the following ingredients:

(IV) 86.62 percent of silver powder from Metz Metallurgical Co. known as METZ EG200ED; and (V) 4.35 percent of silver flake also from Metz Metallurgical Co. known as METZ 50S.

More particularly, the phenoxy resin is dissolved in diethylene glycol monobutyl ether acetate with agitation. The epoxy resin is added to this mixture while agitation is continued. Then, silver powder is added to the mixture under continued agitation until it is dispersed to a Hegman grind of six. Then, the silver flake is added until it is also dispersed to a grind of six or better. The viscosity of the mixture is 35,000 cps. as determined with a Brooksfield RVT Viscometer at 24° C. using a number six spindle at 20 rpm. The 2.5/20 rpm viscosity ratio is 4. The conductive metal and binder are mixed together until completely homogenized to form an ink.

This conductive ink is screen printed (U.S. Sieve size 230), using conventional techniques, onto the VNS Supermat release paper (obtained from S. D. Warren Co., Westbrook, Maine) to a thickness of approximately 1 mil after drying.

The printed paper is dried in a forced convection oven at 96° C. for ten minutes.

Separately, an adhesive containing the following ingredients is prepared:

| TRADE NAME | CHEMICAL NAME | PERCENT (WT) |
| --- | --- | --- |
| PHENOXY PKFE | POLYHYDROXYETHER | 18.99 |
| RESIMENE 2040 | MELAMINE FORMALDEHYDE | 0.95 |
| BUTYL CARBITOL ACETATE | DIETHYLENE GLYCOL MONOBUTYL ETHER ACETATE | 75.96 |
| BLACK SAPL | NIGROSINE BLACK | 0.19 |
| BENZOIC ACID | BENZOIC ACID | 0.05 |
| CABOSIL | SILICA | 3.86 |

MAKING THE ADHESIVE

The polyhydroxyether or phenoxy resin is dissolved in the diethylene glycol monobutyl ether acetate using high speed mixing until all the resin particles are dissolved. The melamine formaldehyde resin is then added. The nigrosine black and benzoic acid are mixed together and then added with high shear agitation. The high surface area silica is then added with high shear mixing. The entrained air is removed with vacuum. The viscosity of the adhesive composition measured with an RVT Viscometer at 24° C. using a number six spindle at 20 rpm is 35,000 cps with a 2.5/20 rpm viscosity ratio of 4.

The prepared adhesive is screen printed in registration on top of the conductor surface of the printed circuit which is already dried. Then, the adhesive coated circuit is placed in a forced convection oven at 96° C. for 10 minutes until the adhesive coat is dry but not fully cured.

A substrate is molded from a composition containing 78 weight percent of a polymer containing the following unit:

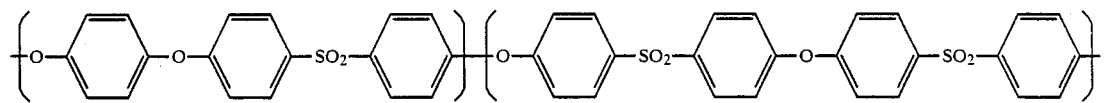

having a reduced viscosity of 0.61 dl/g as measured in N-methyl-pyrrolidone (0.2 g/100 mil) at 25° C. The composition also contains 10 weight percent mica and 10 weight percent of chopped glass fibers obtained from Owens Corning.

The substrate composition is injection molded using conventional conditions. A 6×6 plaque which is 0.06" thick is molded. The melt temperature is 377° C., and the mold temperature is 152° C. The injection speed is 35 mm/sec, and the injection molding pressure is 100 bars for 7 sec.

The substrate sheet is treated with a methylene chloride adhesion promotor The liquid promotor is used at room temperature. The period for vapor polishing is three seconds. The treated substrate is air dried.

The substrate is placed in a compression platen press with the release paper containing the conductor (1.0–1.2 mils dry film thickness) and the adhesive printed in registration (0.6–0.8 mils dry film thickness). One of the platens is fitted with a diaphragm or bellows. Then it is molded at 600 psi for 3 minutes at 177° C. after the release paper is stripped away.

The composite is cured in an oven at 150° C. for 30 minutes. After cure, the composite can be soldered with a hand soldering iron or in a wave solder machine set at 377° C. with a carrier speed of 6 ft/min. The electrical resistance of a square serpentine pattern was measured with a milliohm meter. Consistent values in the range of 5–10 milliohms/1 mil square are obtained.

For bond strength determination, copper wires (0.05/inch diameter) are soldered onto ¼ inch diameter pads of the composite. After cooling, the wires are pulled from the boards clamped onto the base of a Chatillon tensile tester Model UTSM. The wires are hooked onto the end of a AMETEK ACCU Force Gage II. The composite is then lowered at the #1 setting of the chatillon tester, and the maximum force is measured to break the bond between the wire and the ¼ inch pad on a 1/16 inch composite.

EXAMPLE 2

Example 1 is repeated except that the solder mask composition contains:

| TRADE NAME | CHEMICAL NAME | PERCENT (WT) |
| --- | --- | --- |
| PHENOXY PKFE | POLYHYDROXYETHER | 14.42 |
| BUTYL CARBITOL ACETATE | DIETHYLENE GLYCOL MONOBUTYL ETHER ACETATE | 45.84 |
| CYMEL 325 | MELAMINE FORMALDEHYDE | 5.77 |
| DEN 431 | EPOXY NOVOLAC | 1.68 |
| ALTALC 500 | TALC | 22.15 |
| 50-2610 RBH DISPERSION | PHTHALO CYANINE GREEN (IN EPOXY RESIN, TOLUENE, BUTANIL) | 3.83 |
| NACURE 1419 | DINONYLNAPHTHALENE SULFONATE ESTER (IN XYLENE, METHYL ISOBUTYLKELENE) | 1.21 |
| SILANE A-187 | GAMA-GLYCIDOXY PROPYL TRIMETHOXY SILANE | 0.20 |
| QUSO WR-50 | SILOXANE, DIMETHYL REACTION PRODUCTS WITH SILICA | 3.36 |
| BYK 053 | SOLUTION OF POLYALKYL ACRYLATE | 1.07 |
| BYK 077 | SOLUTION OF METHYLALKYL POLYSILOXANE | 1.48 |

Although the invention has been described in conjunction with specific embodiments, it is evident that many alternatives and variations will be apparent to those skilled in the art in light of the foregoing description. This may include optionally plating the printed circuit even though the circuit is solderable without this treatment. Accordingly, the invention is intended to embrace all of the alternatives and variations that fall within the intended spirit and scope of the appended claims.

What is claimed:

1. A process for forming a directly solderable printed circuit article comprising:
    (1) providing a release surface;
    (2) applying a solder mask over the release surface and drying the solder mask wherein the solder mask comprises polyhydroxyether, melamine formaldehyde, solvent, filler and flow control agent;
    (3) applying an ink comprising a thixotropic thermosetting resin composition containing a desired amount of an electrically conductive metal powder and high surface area metal flake to the release surface over the mask in the configuration of a solderable electric circuit element and drying the ink;
    (4) printing in registration with the ink circuit element and mask a reactive thixotropic adhesive interface capable of interacting with the thermosetting resin composition of step (3) and with a thermosetting dielectric surface and drying the adhesive;
    (5) bringing together the release surface and the thermoplastic dielectric surface so that the solderable electrical circuit element is facing the dielectric surface and is separated therefrom by the adhesive interface; and
    (6) applying sufficient heat and pressure to form a composite structure whereby the thermosetting resin is cured and the adhesive is interacted whereby the electrical circuit element is transferred from the release surface and bonded to the thermoplastic dielectric surface.

2. A process for forming a directly solderable printed circuit article comprising:
    (1) providing a release surface;
    (2) applying a solder mask over the release surface and drying the solder mask wherein the solder mask comprises polyhydroxyether, melamine formaldehyde, solvent, filler and flow control agent;
    (3) applying an ink comprising a thixotropic thermosetting resin composition containing a desired amount of an electrically conductive metal powder and high surface area metal flake to the release surface over the mask in the configuration of a solderable electric circuit element and drying the ink;

(4) printing in registration with the ink circuit element and mask a reactive thixotropic adhesive interface capable of interacting with the thermosetting resin composition of step (3) and with a thermoplastic dielectric surface and drying the adhesive;

(5) bringing together the release surface and the thermoplastic dielectric surface so that the solderable electrical circuit element is facing the dielectric surface and is separated therefrom by the adhesive interface; and (6) applying sufficient heat and pressure to form a composite structure whereby the thermosetting resin is cured and the adhesive is interacted whereby the electrical circuit element is transferred from the release surface and bonded to the thermoplastic dielectric surface;

wherein the solder mask comprises about 12% polyhydroxyether, about 60% diethylene glycol monobutyl ether acetate, about 3% melamine formaldehyde, about 3% phthalo cyanine green, about 18% mica, about 2% epoxy resin, about 3% silica, and a reaction promoting concentration of dinonylnaphthalene sulfonate ester, all percentages by weight of the composition.

3. The process according to claim 1, wherein the solder mask comprises about 10 to 16 weight percent polyhydroxyether, about 2 to 7 weight percent melamine formaldehyde, about 37 to 70 weight percent solvent having a boiling point between about 230° C. to 250° C., about 14 to 27 weight percent filler, and about 2.5 to 4.5 weight percent flow control agent, all percentages by weight of the composition.

4. The process according to claim 1, wherein the solder mask comprises about 12% polyhydroxyether, about 60% diethylene glycol monobutyl ether acetate, about 3% melamine formaldehyde, about 3% phthalo cyanine green, about 18% mica, about 2% epoxy resin, about 3% silica, and a reaction promoting concentration of dinonylnaphthalene sulfonate ester, all percentages by weight of the composition.

* * * * *